(12) United States Patent
Walker et al.

(10) Patent No.: US 8,414,785 B2
(45) Date of Patent: Apr. 9, 2013

(54) METHODS FOR FABRICATION OF MICROFLUIDIC SYSTEMS ON PRINTED CIRCUIT BOARDS

(75) Inventors: Christopher I. Walker, Pasadena, CA (US); Aditya Rajagopal, Irvine, CA (US); Axel Scherer, Laguna Beach, CA (US)

(73) Assignee: California Institute of Technology, Pasadena, CA (US)

( * ) Notice: Subject to any disclaimer, the term of this patent is extended or adjusted under 35 U.S.C. 154(b) by 714 days.

(21) Appl. No.: 12/572,211

(22) Filed: Oct. 1, 2009

(65) Prior Publication Data

US 2010/0084371 A1    Apr. 8, 2010

Related U.S. Application Data

(60) Provisional application No. 61/194,970, filed on Oct. 2, 2008.

(51) Int. Cl.
*H05K 3/06* (2006.01)

(52) U.S. Cl.
USPC ........ 216/17; 216/2; 216/27; 216/49; 216/96; 438/106; 438/48; 438/696

(58) Field of Classification Search ............ 118/72; 137/454.2, 597, 824, 833; 156/300; 216/17, 216/2, 27, 49, 96; 257/208, 415; 359/290, 359/291; 366/118, 144, 177.1, 341; 435/287.2, 435/288.5, 6.11, 7.1; 436/180, 526; 438/106, 438/48, 49, 50, 590, 696, 745
See application file for complete search history.

(56) References Cited

U.S. PATENT DOCUMENTS

| | | | |
|---|---|---|---|
| 3,945,618 A * | 3/1976 | Shoh | 366/118 |
| 6,379,974 B1 * | 4/2002 | Parce et al. | 436/180 |
| 6,443,179 B1 * | 9/2002 | Benavides et al. | 137/454.2 |
| 6,590,032 B2 * | 7/2003 | Furukawa et al. | 525/106 |
| 2004/0027915 A1 * | 2/2004 | Lowe et al. | 366/341 |
| 2004/0067603 A1 * | 4/2004 | Hagen | 438/106 |
| 2007/0093045 A1 * | 4/2007 | Yamaguchi et al. | 438/590 |

OTHER PUBLICATIONS

Duffy, D., et al., Rapid prototyping of microfluidic systems in poly(dimethylsiloxane), Analytical Chemistry 1998, 70: 4074-4984.
Laritz, C., et al., A microfluidic pH-regulation system based on printed circuit board technology, Sensors and Actuators 2000, 84: 230-235.

(Continued)

*Primary Examiner* — Duy Deo
*Assistant Examiner* — Erin Berner
(74) *Attorney, Agent, or Firm* — Steinfl & Bruno LLP

(57) ABSTRACT

Methods for fabrication of microfluidic systems on printed circuit boards (PCB) are described. The PCB contains layers of insulating material and a layer or layers of metal buried within layers of insulating material. The metal layers are etched away, leaving fully enclosed microfluidic channels buried within the layers of insulating material.

13 Claims, 17 Drawing Sheets

OTHER PUBLICATIONS

Lian, K., et al., Integrated microfluidic components on a printed wiring board platform, Sensors and Actuators B: Chemical 2009, 138: 21-27.

Merkel, T., et al., A new technology for fluidic microsystems based on PCB technology, Sensors and Actuators 1999, 77: 98-105.

Metz, S., et al., Polyimide-based microfluidic devices, Lab on a Chip 2001, 1: 29-34.

Unger, M., et al., Monolithic microfabricated valves and pumps by multilayer soft lithography, Science 2000, 288: 113-116.

Wego, A., et al., Fluidic microsystems based on printed circuit board technology, Journal of Micromechanical and Microengineering 2001, 11: 528-531.

* cited by examiner

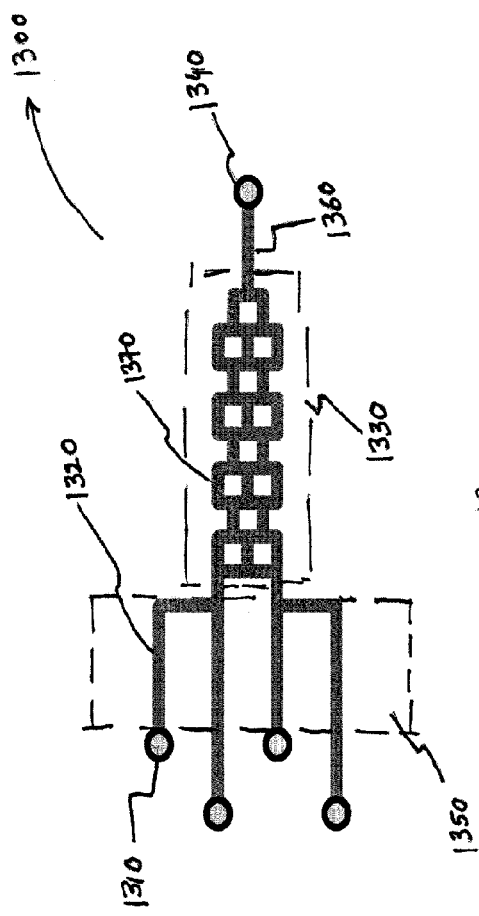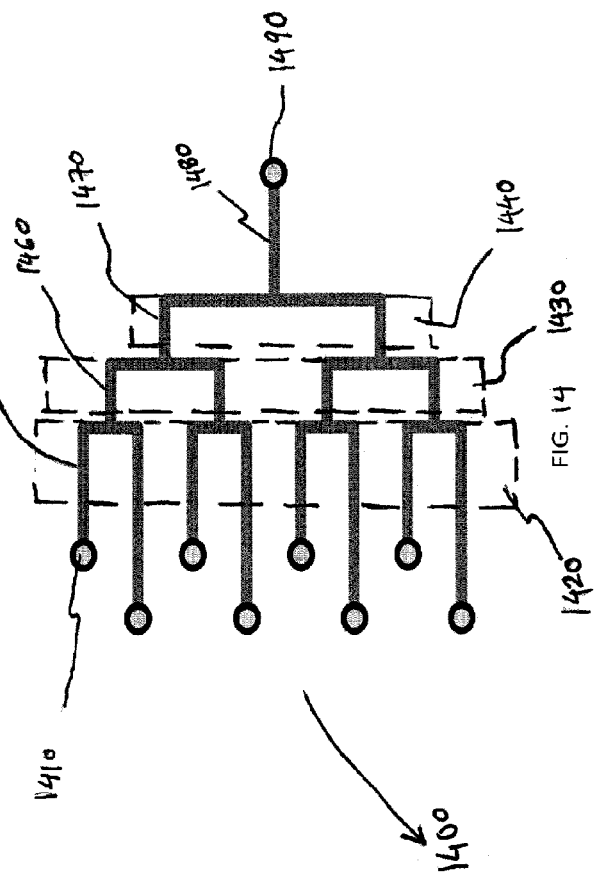

METHODS FOR FABRICATION OF MICROFLUIDIC SYSTEMS ON PRINTED CIRCUIT BOARDS

CROSS REFERENCE TO RELATED APPLICATIONS

The present application claims priority to U.S. Prov. App. No. 61/194,970 filed on Oct. 2, 2008, which is incorporated herein by reference in its entirety.

STATEMENT OF GOVERNMENT GRANT

The U.S. Government has certain rights in this invention pursuant to Grant No. W911NF-07-1-0606 awarded by the U.S. Army Research Office.

FIELD

The present disclosure relates to microfluidic systems. More in particular, it relates to methods for fabrication of microfluidic systems on printed circuit boards.

BACKGROUND

Microfluidics is a rapidly emerging field of interest. It is defined by the manipulation of fluids, typically aqueous solutions, on the scales of microliters. Microfluidic chips, miniaturized systems which control fluid flow, and processing, can be used for a variety of applications. These applications are typically in the realm of biochemistry—drug screening, stem cell analysis, cell sorting, and disease detection. Advantages of a microfluidic approach to these applications include reduced reagent volume, the ability to parallel process many samples on a small chip, and an overall reduction in system scale, allowing for field-portable instruments.

Microfluidic chips are systems of small channels (usually 10-100 microns in size), often with integrated pumps and mixing chambers, and occasionally ports for electrical or optical analysis. Much of the worth of these chips lies in the fact that they are built with techniques amenable to batch fabrication. As in the semiconductor chip industry, batch fabrication enables lower cost production, and increased integration of functionality on a single chip. There are a wide variety of batch fabrication techniques capable of producing microfluidic chips—etching channels in glass or silicon, injection molding of plastics, replication molding of PDMS (polydimethylsiloxane) polymer. More recently, there has been interest in adapting printed circuit board (PCB) techniques to create microfluidic systems.

Printed circuit board fabrication techniques are a natural fit to the problem of creating microfluidic chips. The size scales involved (50-100 micron traces) are the same size scales used in microfluidic chips for channels; the fabrication technologies have been well-developed by the electronics industry over the past 40 years, with associated reduction of production cost; finally, these techniques allow for easy integration of electronic systems with microfluidic ones.

PCBs are composed of alternating planar layers of insulating materials (FR4, polyimide, ceramics), and layers of conducting metals (copper, aluminum, gold) which have been defined through photolithography to form systems of traces, or conducting circuits. Holes between layers are drilled, and sometimes plated, to allow for vias, or vertical connections between layers.

The most common materials system for a PCB is one composed of FR4 (fiberglass in an epoxy matrix) for the insulator and copper for the traces. Boards are typically fabricated by performing photolithography and etching on a two-sided copper-clad FR4 core, drilling and plating holes for buried vias, and then laminating these cores together. By doing so, finished boards with an arbitrary number of buried traces and vias may be produced. Finally, holes for discrete components (semiconductor devices, resistors, etc) are drilled and plated, as are alignment and mounting holes. Boards are typically processed in the form of large panels, and later sawed (diced) into individual boards, allowing many discrete boards to be fabricated in a single batch.

A variety of implementations of PCB technology to microfluidic applications have been tried, all of which require either modification of the PCB process flow, or some type of post-processing to obtain a microfluidic system. These include:

1. Etching a top copper layer to form a 3-sided channel (FR4 bottom, copper sidewalls) and then sealing the channel with a plate to form a fully enclosed channel. (Merkel, Graeber, Pagel, 1999; Nguyen and Huang, 2000). This technique can create microfluidic chips with two layers.
2. Etching a top copper layer on both of two PCBs, which are then aligned and laminated to form a fully enclosed system of channels (Wego, Richter, Pagel, 2001). This technique can be extended to an arbitrary number of microfluidic channel layers.
3. A modification of technique (1), using a thin silicone membrane instead of a plate to seal 3-sided channels (Läritz, Pagel, 2000)
4. Laminating a PCB with "pre-carved channels" to another PCB (Lian, O'Rourke, et. al., 2009)
5. Etching a 3-sided channel into a polyimide layer, and then sealing the resulting open channel with a film of polyimide (Metz, Holzer, Renaud, 2001)

All of these techniques rely on fabricating a system of open (3-sided) channels, and then laminating them with either a cover plate/film, or to another PCB. While much of the process flow is compatible with widespread industry practices, there is often a process step inserted into this process flow. Additionally, care must be taken during lamination steps that the open channels do not become filled with laminating resin, and thus blocked.

Microfluidic chips fabricated out of polydimethylsiloxane (PDMS) are a field that rapidly expanded in the early 2000's. PDMS is a type of silicone polymer that is: biocompatible (useful as a container for a variety of biochemical reactions); optically transparent, with low autofluorescence (good for optical monitoring of biochemical reactions); and mechanically, quite soft. The fact that it is deformable makes it an excellent gasket material, and allows for the construction of integrated microfluidic channels ("Rapid Prototyping of Microfluidic Systems in Poly(dimethylsiloxane)", David C. Duffy, J. Cooper McDonald, Olivier J. A. Schueller, and George M. Whitesides, Analytical Chemistry, 1998, 70, 4974-4984) and valves ("Monolithic Microfabricated Valves and Pumps by Multilayer Soft Lithography", Marc A. Unger, Hou-Pu Chou, Todd Thorsen, Axel Scherer, Stephen R. Quake, Science, Vol 288 7 Apr. 2000 p. 113-116), through replication molding. PDMS is inexpensive, and the ease with which it can be used to create large, integrated microfluidic systems has enabled its widespread use.

Unfortunately, connecting PDMS microfluidic chips to other control or analysis systems is often difficult. The most common approach used is to punch cylindrical hole through the chip which intersects one of the fluid channels; a stainless steel capillary tube, which will later be connected to a small diameter Tygon® tube, is then inserted in the hole, and kept in place by the gasket-like deformation of the PDMS. This process must be repeated for each channel in the chip which requires access to outside fluids or controls (each port). This is a labor intensive, and generally painful process. Finally, due to the mismatch in size scales between the connecting tubes, and the channels on the chip, the chip may have to be much larger in area than required by its functionality to accommodate the connections. This problem is very similar to that faced by semiconductor chip designers, who must allocate large amounts of chip area to wire bonding/bump bonding pads for connection to the chip package.

Another approach to connection is to machine a manifold structure having on one side a flat face (output face), which will be pressed to the PDMS chip, and on the other, capillary tubes which will be connected to tubing. The manifold contains routing channels from the tubes to small holes on the output face, which match up to channels on the PDMS chip. Such manifolds have been manufactured through techniques such as injection molding and conventional metal machining (milling, electro-discharge machining, etc) techniques. A connection manifold is directly analogous to a socket for integrated circuits in functionality.

SUMMARY

According to an aspect, a method for fabrication of microfluidic systems on printed circuit boards is provided, comprising: providing a printed circuit board comprising two or more layers of insulating material and one or more layers of metal, wherein at least one layer of metal is buried within two layers of insulating material, and etching at least a portion of the at least one buried layer of metal to provide one or more buried microfluidic channels.

Further aspects of the present disclosure are shown in the description, drawings and claims of the present application.

BRIEF DESCRIPTION OF THE DRAWINGS

FIG. 13 shows a four to one microfluidic mixer.

FIG. 14 shows an eight to one microfluidic mixer.

DESCRIPTION OF EXAMPLE EMBODIMENTS

Methods to fabricate microfluidic chips within the materials, systems and process flows of PCBs will be described in accordance with the present disclosure.

In what follows definitions of few terms used throughout the present disclosure are given.

A "core" as used herein is a thin, planar element of insulating material (e.g., FR4, ceramic) on which a metal film may be bonded and patterned. Printed circuit boards are composed of one or more cores laminated together.

A "layer" as used herein is a patterned film of metal bonded to an insulating core. Layers may be either external, or internal. In case of internal layers, a core containing one or more layers is laminated to another core with a layer on a face where lamination occurs. For example, a board comprising two cores which have been laminated together will be either a two layer board (no internal metal films), a three layer board (one of the cores has a metal layer on it), or a four layer board (both of the cores have metal layers which are bonded together).

The term "buried" or "enclosed", means confined laterally and vertically within a core of homogeneous insulating material. A buried channel may be connected to a surface of a board through a via hole or well, or through other buried channels which eventually connect to a via hole or well. In general, a buried element may be connected only to an outside face of a board only through a non-buried element, the exception being a buried channel which extends to an edge of a board, leaving it open on the edge face.

A "via" is a hole which penetrates at least one layer of a one or more layer board. For example, a four layer board, with layers one and four on surface, and layers two and three in interior, a via may exist between layers two and three (this is called a "buried via"), between layers three and four (this is called a "blind via", or "blind hole"), between layers one to four (called a "through via", or "through hole").

Figure 1:
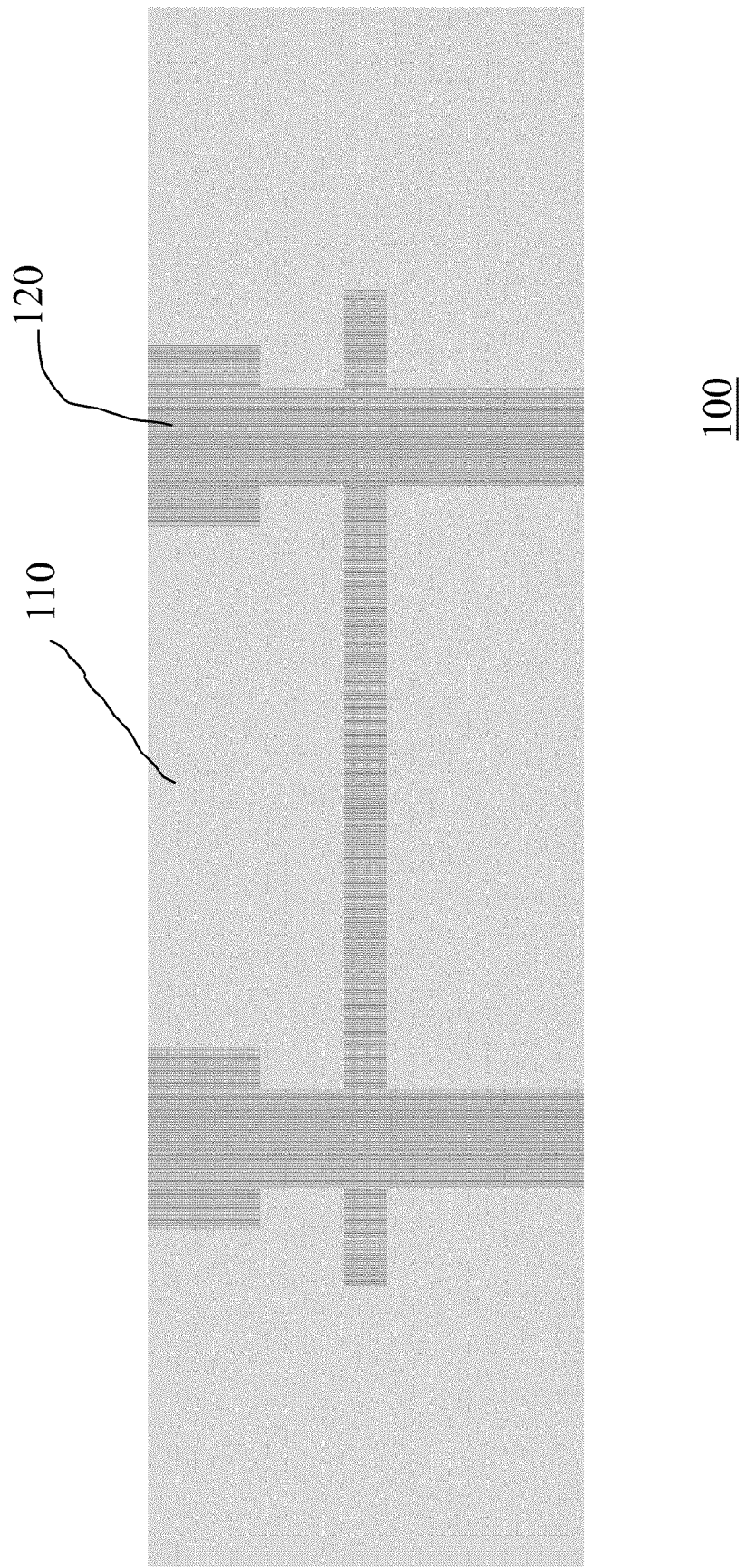
FIG. 1 shows a conventional patterned PCB chip.

FIG. 1 shows a conventional patterned PCB 100 comprising a core material 110 and metal layers 120. Core materials may include, for example, insulators such as FR4, polyimide, ceramic, glass-reinforced resin, and so on. Metal layers may include, for example, copper, gold, etc. In the following figures, reference will be made to FR4/copper materials systems by way of example and not of limitation.

Boards of arbitrary thickness and layer count may be fabricated. In accordance with the present disclosure, microfluidic channels will be defined by buried traces which are connected through vias/holes to the surface of the board. In accordance with the teachings of the present disclosure, a board will contain at least one layer of buried (completely enclosed) traces. The person skilled in the art will understand that, in accordance with the process of the present disclosure, the PCB process flow is not altered at an intermediate stage, rather, an etching step is performed at the end of the process flow.

Figure 2:
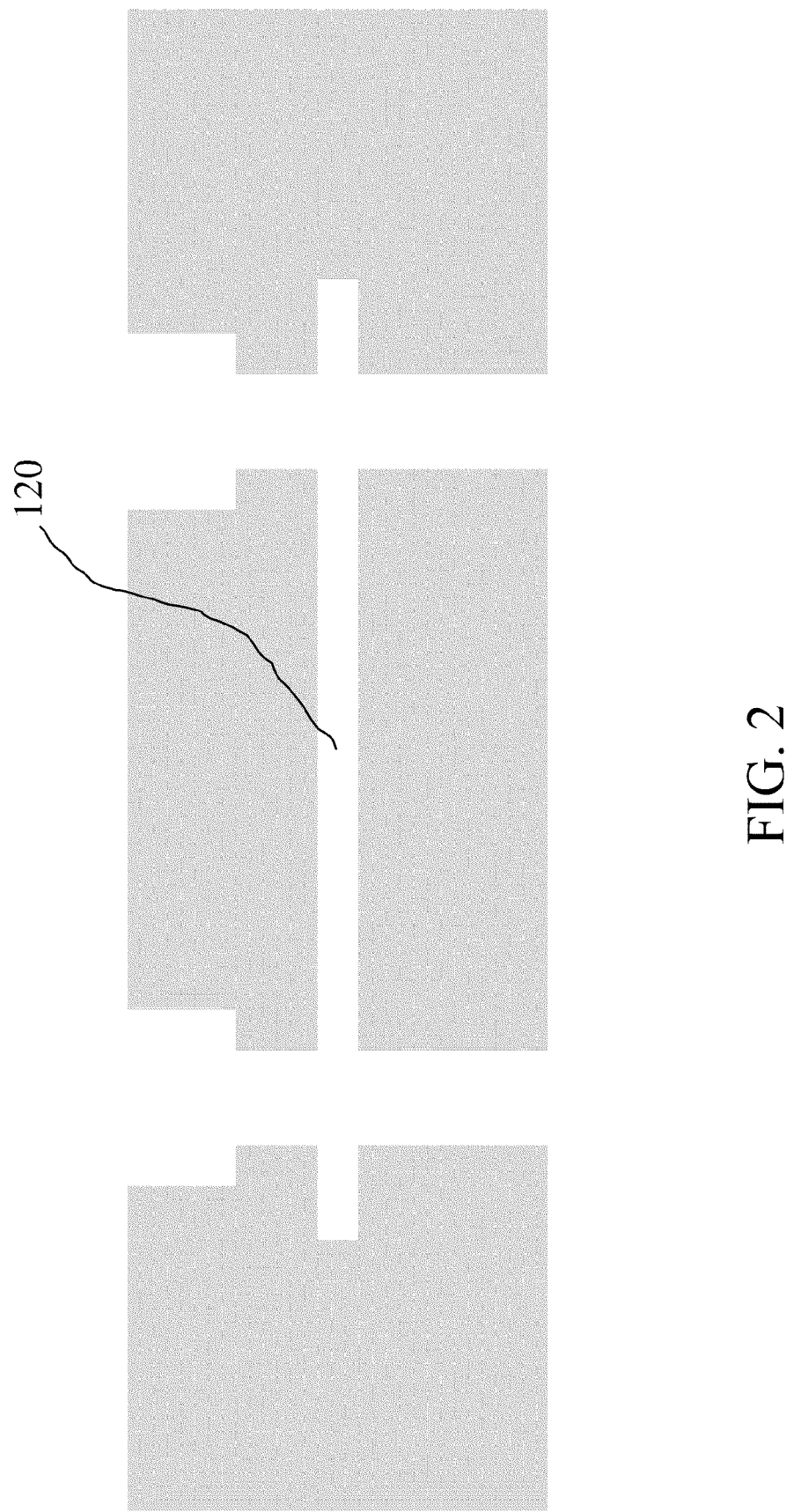
FIG. 2 shows the PCB chip of FIG. 1 with metal traces etched away.

The board is then immersed in an etchant solution targeted at the copper layers 120. There are a wide variety of copper etches used by the PCB industry (ferric chloride, ammonium persulphate, etc; Applicants used ferric chloride to build their devices). The etchant solution is then agitated (e.g., by way of an ultrasonic bath). As shown in FIG. 2, the copper traces are etched away, leaving a fully-enclosed microfluidic channel buried within the FR4. The etch ratio of copper/FR4 in ferric chloride is effectively infinite, allowing for long buried channels to be etched out without damaging the FR4 core.

The above described etching process can work with our without agitation of the etch solution. However, in cases where a very high aspect ratio hole is being etched, the etch rate becomes limited by the diffusion rates of reactant and byproduct from the copper trace to hole. In those cases, agitation allows better results to be obtained. In particular, ultrasonic agitation forces reactant/byproduct flow to occur at a much higher rate, resulting in etch times that are useful. For example, a 5 mm long buried channel etched without agitation takes roughly two weeks of etching time. The same channel, under ultrasonically-assisted etching, takes approximately 10 hours to successfully etch clear. Due to agitation, residues of metals inside the etched channels are taken out and as a result, etching time is improved.

Figure 3:
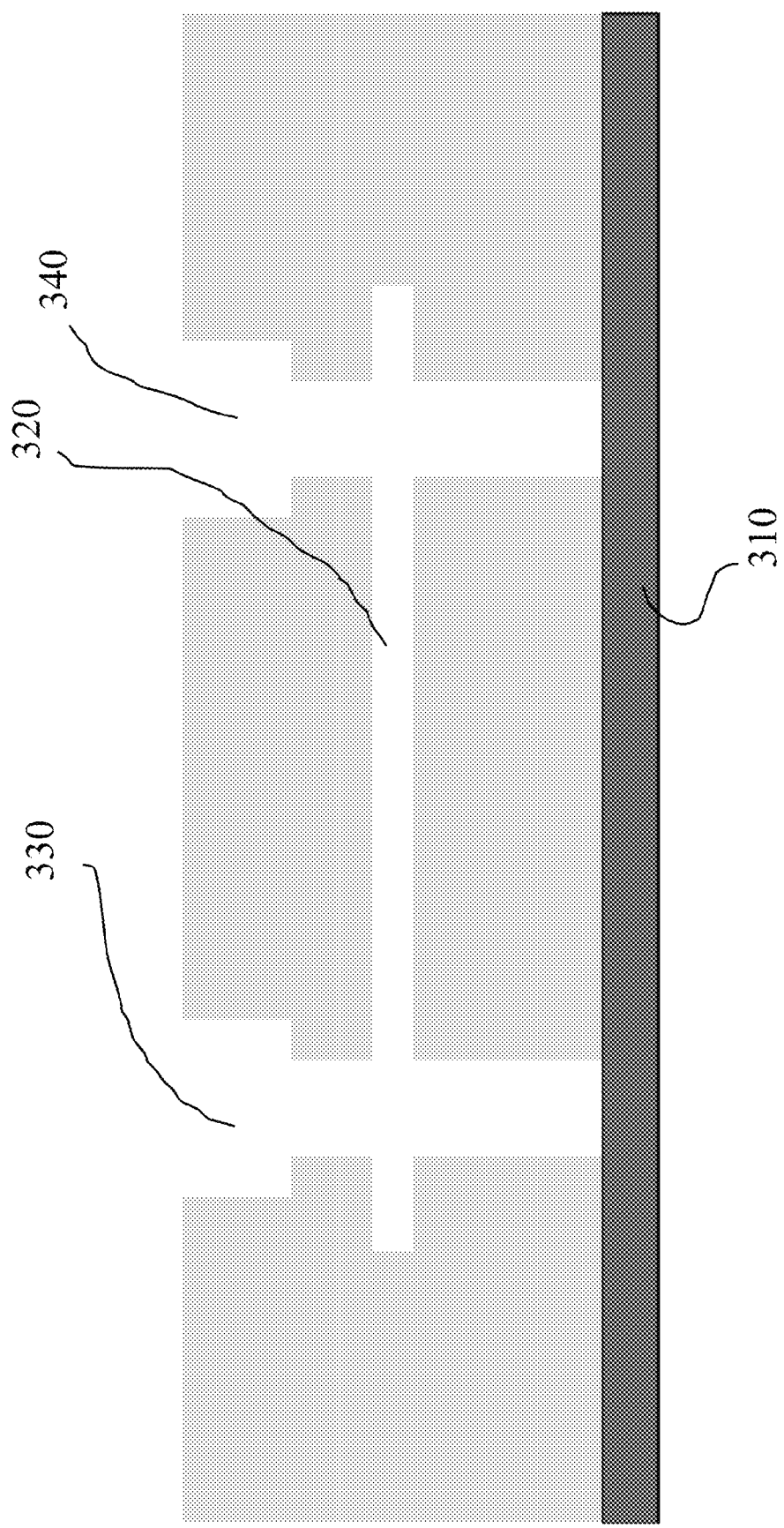
FIG. 3 shows the PCB chip of FIG. 2 with sealed open via holes.

FIG. 3 shows a further step of the present disclosure, where open via holes are sealed with a sealing layer 310 made, for example, of polyimide or glass. The resulting chip contains fully-enclosed microfluidic channels 320, connected to the surface of the chip through via holes 330, 340. The person skilled in the art will understand that printed circuit boards may be manufactured with blind and/or buried holes. In such embodiments no sealing step will be required.

Figure 4:
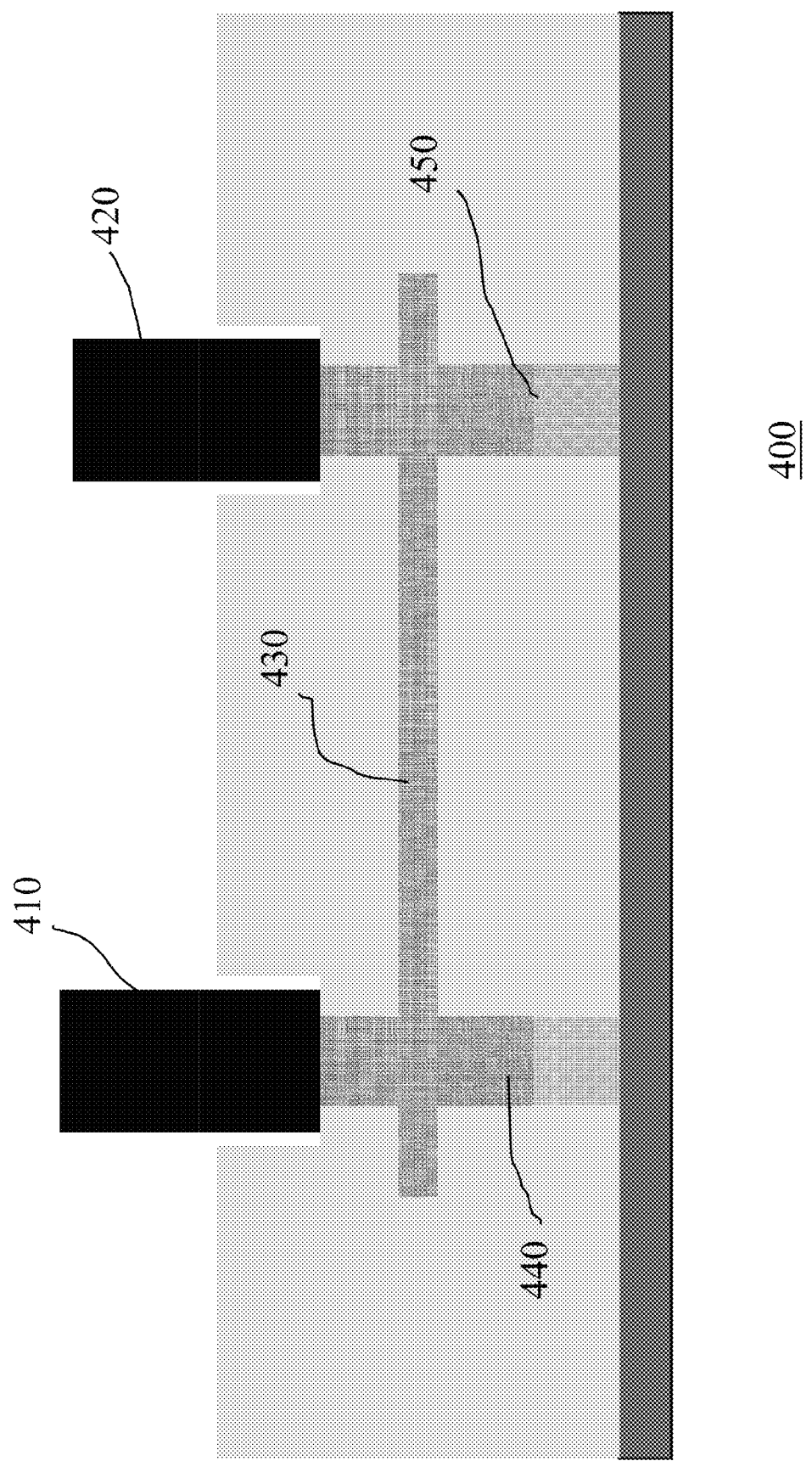
FIG. 4 shows the PCB chip of FIG. 3 with connection tubes mounted.

FIG. 4 shows a further step of the present disclosure, where input and/or output connecting tubes 410, 420 may be placed in/on vias and sealed with, e.g., epoxy resin. Connecting tubes 410, 420 are typically commercially available stainless steel capillaries. This allows for the integration of the chip 400 with other fluidic devices, which often use Tygon Microbore® flexible tubing as an interface. FIG. 4 also shows the presence of liquid in the channels 430, 440, 450. The person skilled in the art will also understand that embodiments can be provided where connection is not required. In these cases connecting tubes will not be needed.

The person skilled in the art will appreciate that, in accordance with the present disclosure, the channels 430 are fully enclosed in the core material of the PCB, rather than the core and a sealing layer.

It can also be noted that, in accordance with the process of the present disclosure, there is no interruption of the PCB fabrication process flow, allowing the use of commodity PCB vendors to source PCB chips. This results in inexpensive chips, with a fast turnaround. Additionally, etching may be performed on many chips simultaneously for batch fabrication. Furthermore, arbitrary numbers of layers of channels/vias may be created on the same chip during the same final etch process. Moreover, there is no planar sealing process of channels, and thus no possibility of leaks from the channels, or blocking of the channels by laminating resin. Via holes may be sealed with a lamination process, but as these are comparatively large, and spaced at least one core board thickness away from the channels, the probability of channel blockage caused by laminating resin is negligible.

Figure 5:
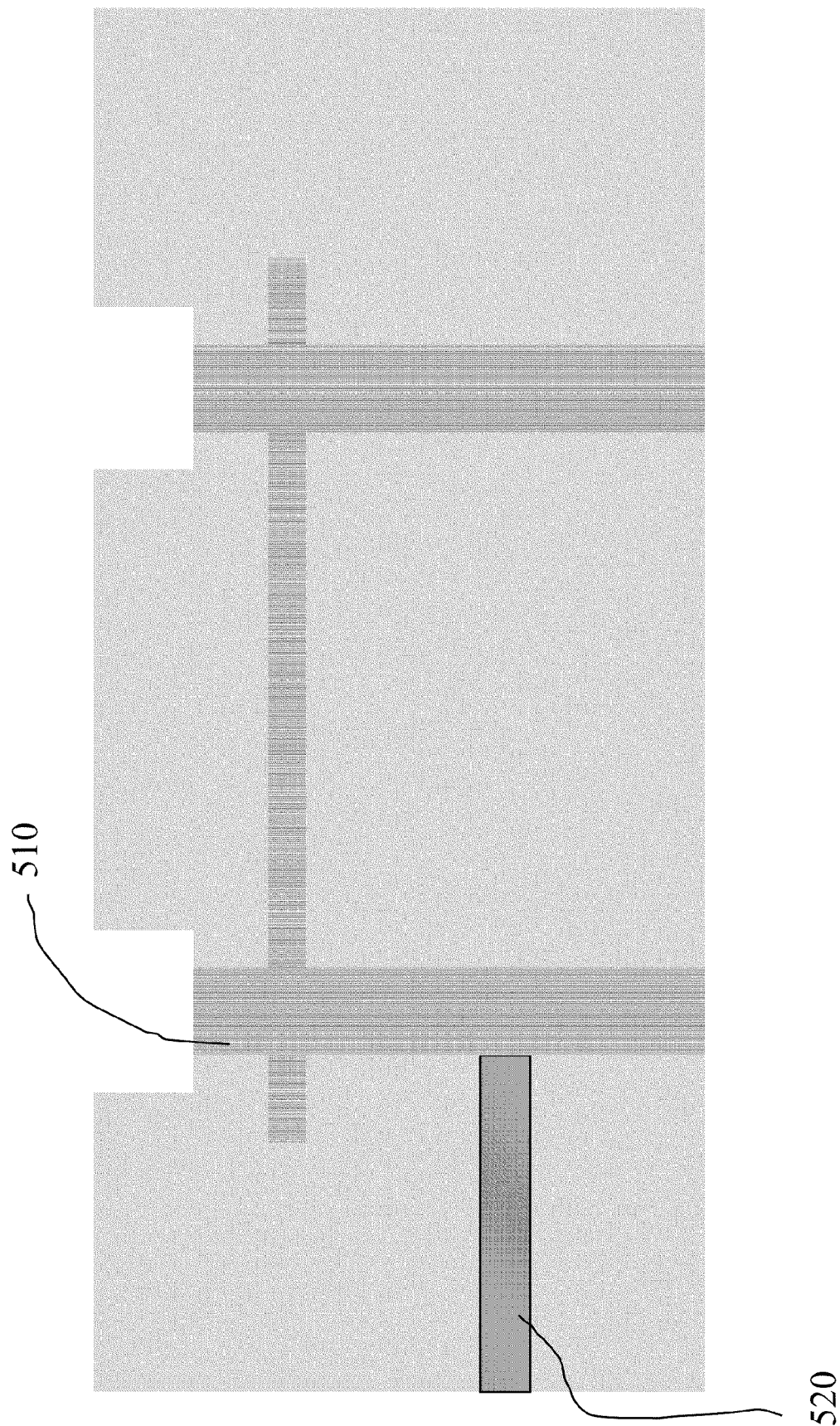
FIG. 5 shows a conventional patterned PCB chip with multiple metal layers.
Figure 6:
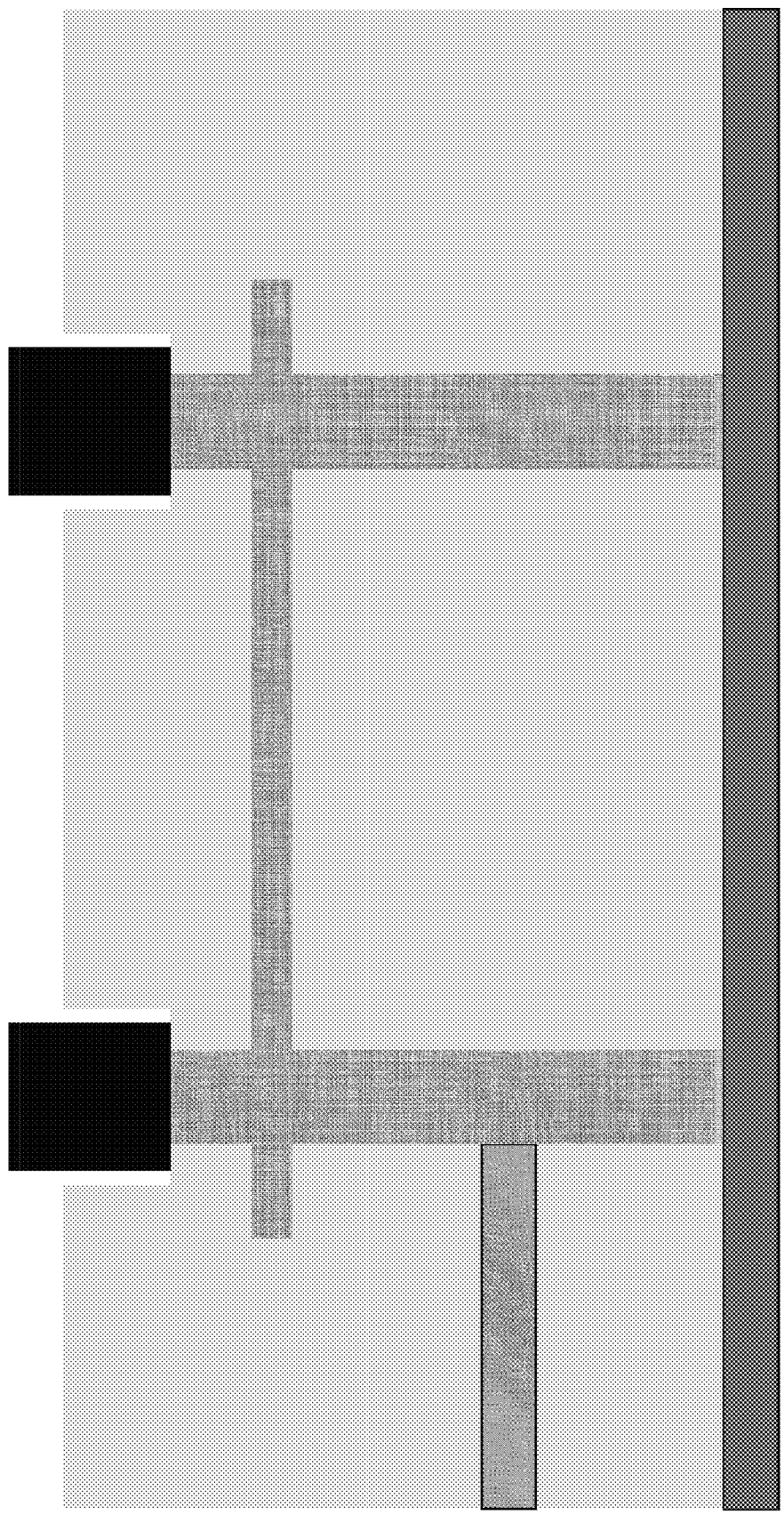
FIG. 6 shows the multiple metal layer PCB of FIG. 5 after etching, connection and sealing.
Figure 7:
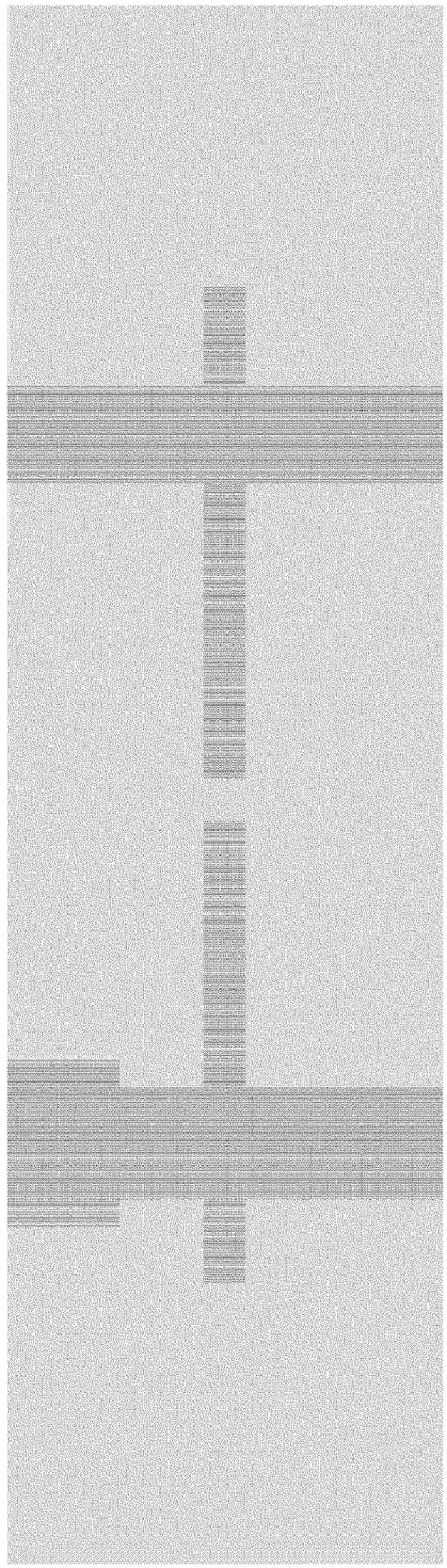
FIG. 7 shows a combined electronic/microfluidic PCB before masking and etching.
Figure 8:
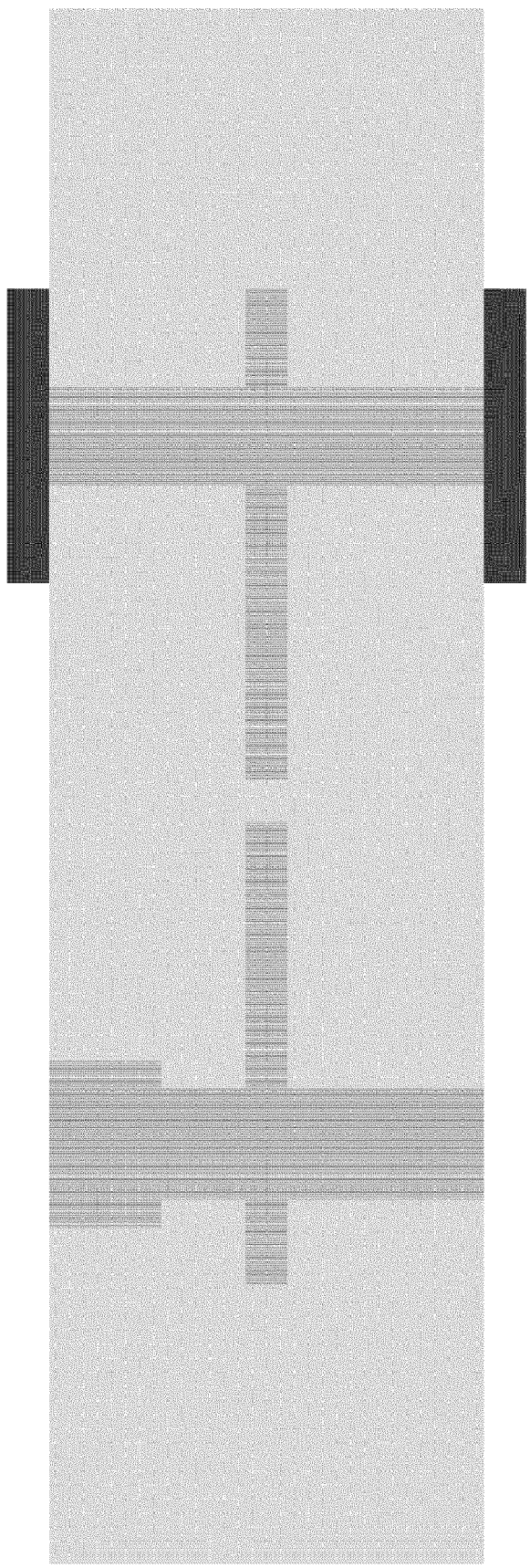
FIG. 8 shows the combined electronic/microfluidic PCB of FIG. 7 after masking.

According to some alternative embodiments of the present disclosure, the above process flow may be modified in a number of ways for additional functionality. For example, as shown in FIG. 5, metal trace layers may be fabricated out of differing metals. In the example of FIG. 5, metal layer 510 is copper and metal layer 520 is gold. This is fully compatible with commercially available PCB processing techniques, and confers the following advantage: by using an etch chemistry which attacks one metal layer (ferric chloride for copper), but which does not attack the other metal layer (gold), metal traces which directly contact the fluid may be fabricated, as shown in FIG. 6. Metal-fluid contact can be used, for example, for heating/cooling or electrical contact. There are some microfluidic devices that use the electrical resistance of an aqueous solution to measure chemical concentrations. Electric fields in solutions can be also be used to move cells or pump liquids (electrophoresis).

Figure 9:
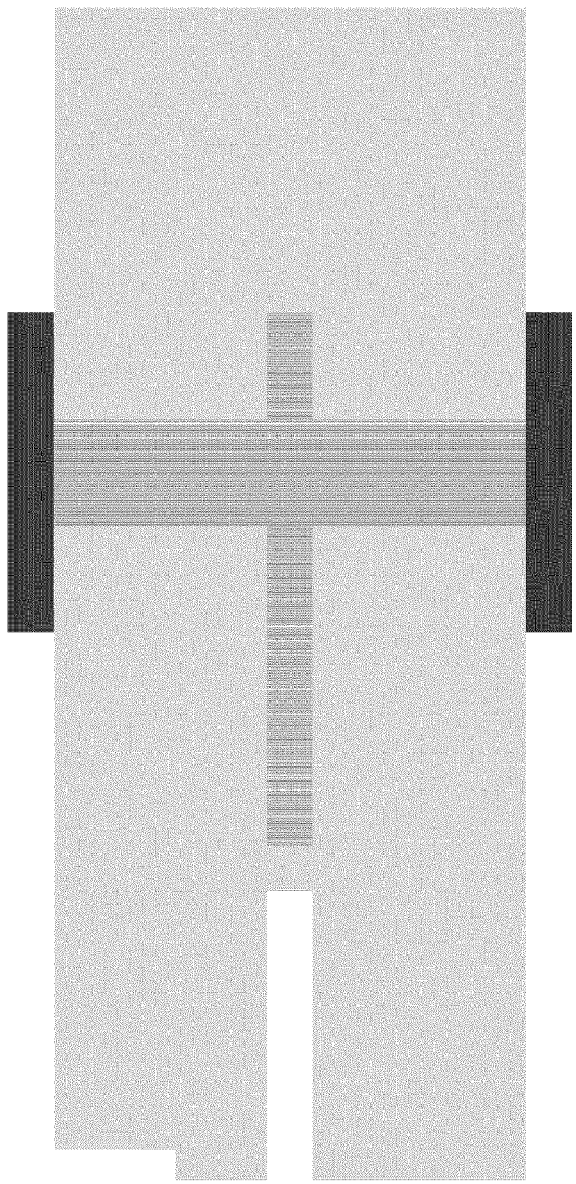
FIG. 9 shows the combined electronic/microfluidic PCB of FIG. 8 after etching.
Figure 10:
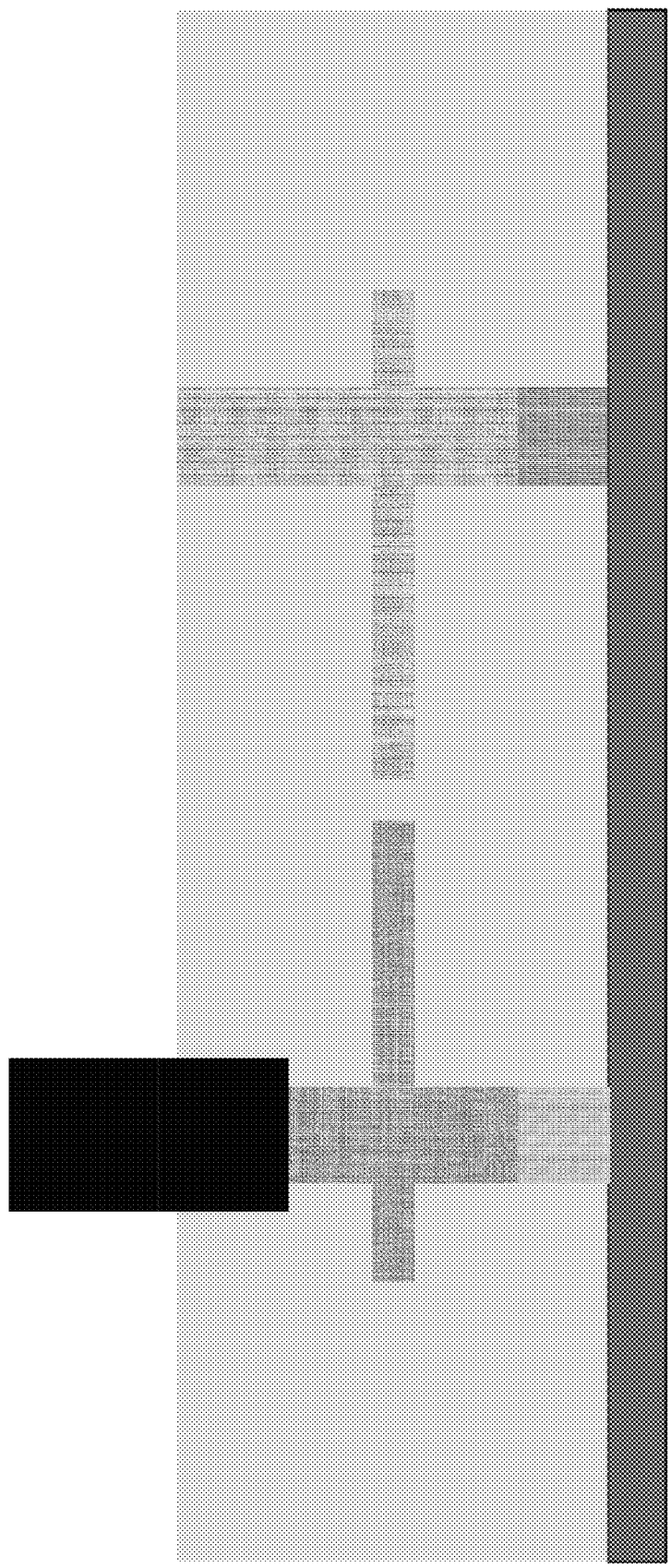
FIG. 10 shows the combined electronic/microfluidic PCB of FIG. 8 after the photoresist has been removed, and after connection and sealing operations.

Further embodiments of the present disclosure can be directed to a board combining electronic functionality and microfluidic channels, without requiring a metal trace in contact with the fluid. As shown in FIGS. 7-10, a conventional multilayer PCB can be fabricated (FIG. 7), the metal areas to be retained can be masked via photolithography (FIG. 8), and the chip etched (FIG. 9). The completed chip (FIG. 10) may then contain fluid channels and electrical traces on the same metal layer.

Devices that can be fabricated with the process according to the present disclosure include, for example, a socket-type connection manifold (described below), a microfluidic mixer, and Microcapillary electrophoresis (MicroCE) chips.

In the following paragraph, a method to build a connection manifold in accordance with the present disclosure will be described.

A PCB containing traces with output vias matched to the input channels of an arbitrary PDMS chip is fabricated using conventional PCB processing techniques previously described. The output vias are connected with traces to vias in a ring or rectangle outside of the input vias, and will be used to mount connecting tubes.

This PCB is then processed using the etching and tube mounting techniques previously described such that one face (the "output face") contains the output vias, and the other face ("input face") contains the mounting tubes.

Figure 11:
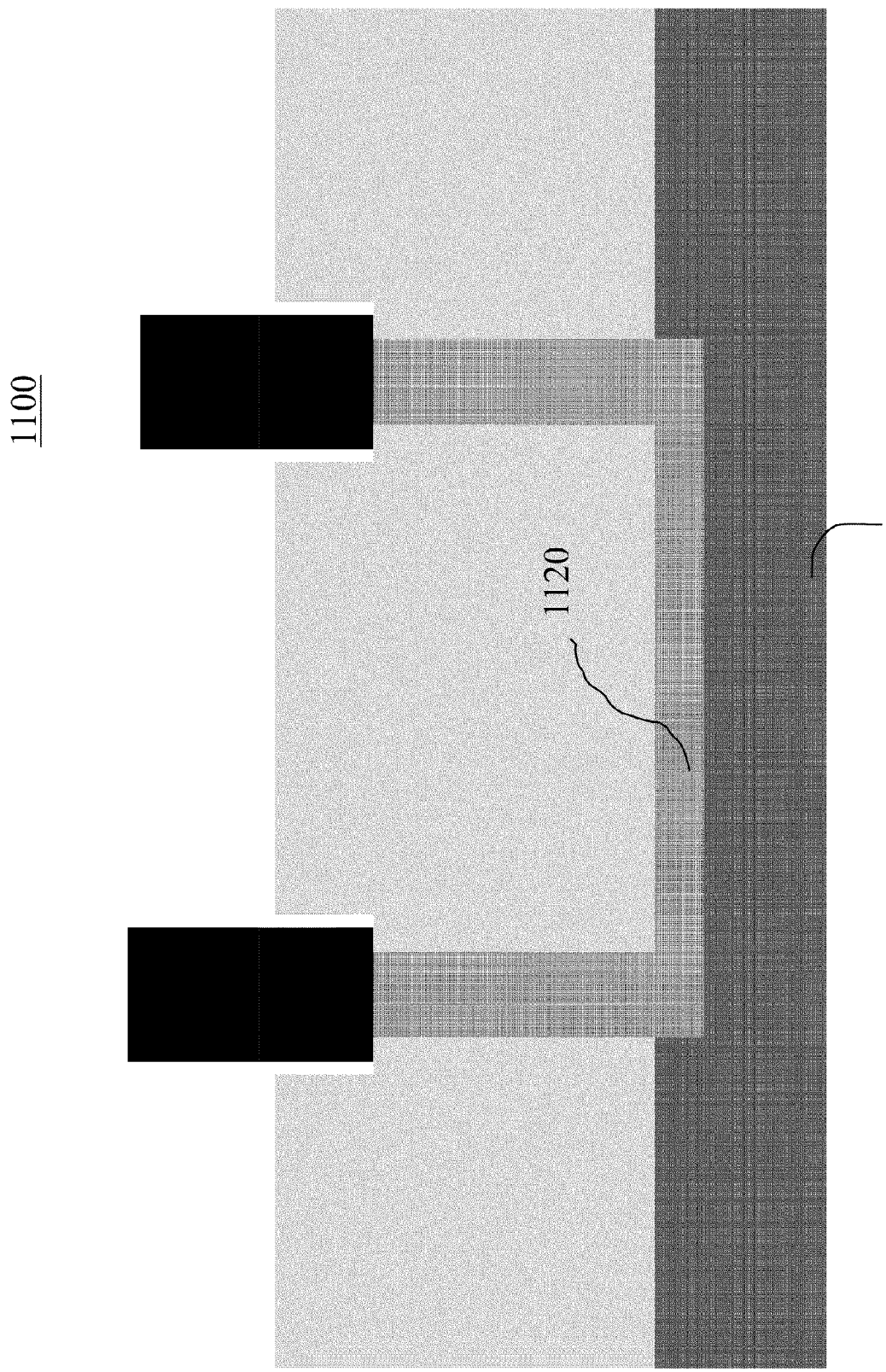
FIG. 11 shows a further embodiment of the present disclosure where the microfluidic PCB is used as a manifold to interface with another microfluidic system.

The resulting connection manifold is pressed against the PDMS chip, which slightly deforms, forming a seal between the PCB manifold and the PDMS chip. FIG. 11 shows the resulting structure 1100, where the seal between PDMS chip 1110 and manifold 1120 are shown.

Figure 12:
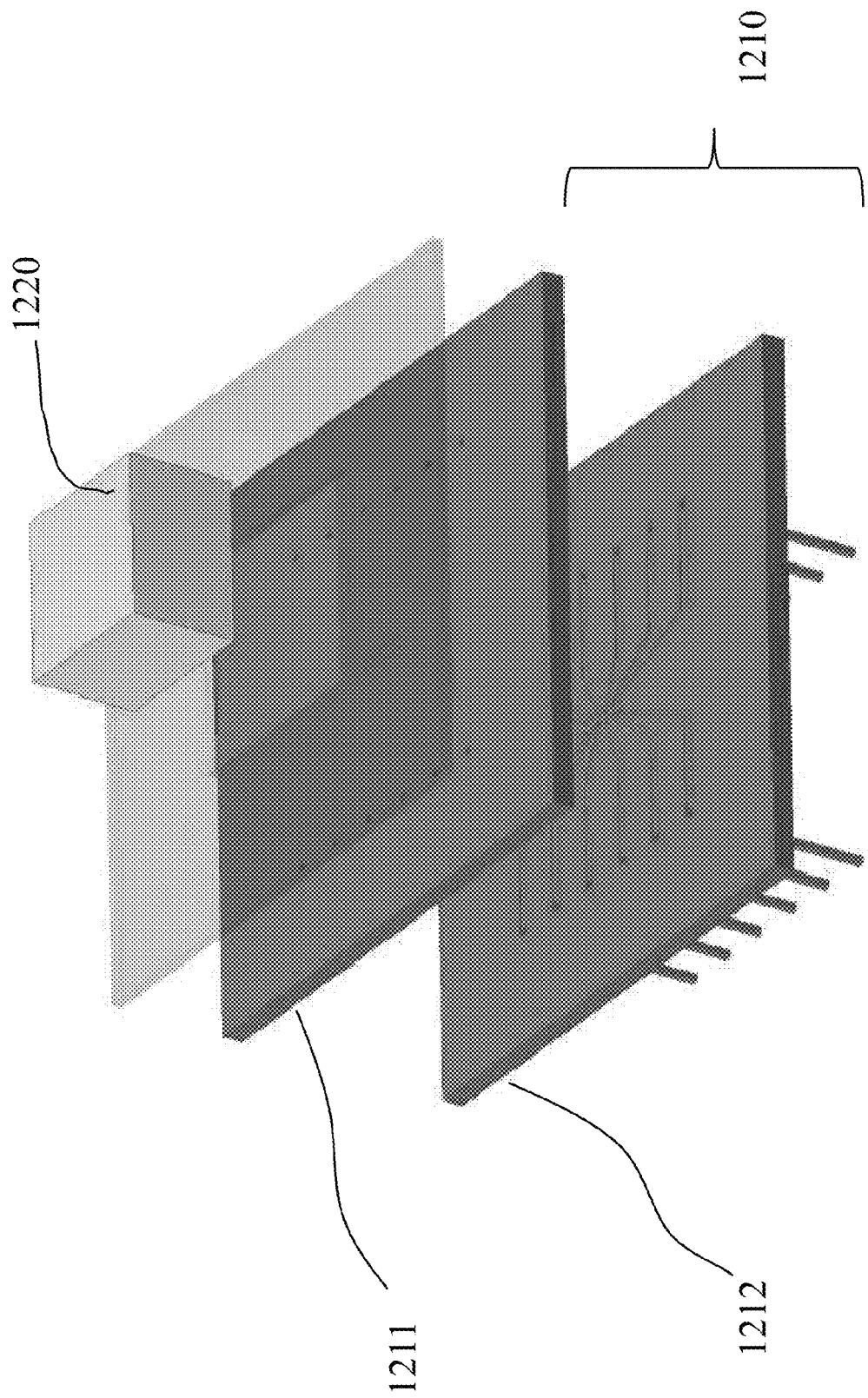
FIG. 12 shows an exploded perspective view of the system of FIG. 11.

FIG. 12 shows an exploded view of the structure of FIG. 11, in which the PCB manifold 1210 is depicted split in two layers 1211, 1212 to show the connecting channels and the PDMS chip 1220 is shown on the top. The manifold chip system may be held together with spring loading, bolted, etc to maintain the seal.

In the following paragraphs, a method to build a microfluidic mixer in accordance with the present disclosure will be described.

A microfluidic mixer is a device in which two or more fluidic channels are combined into one or more channels, mixing incoming fluids. Mixers are useful for performing on chip chemical reactions, mixing reactants for biochemical processes, and generally for controlling the chemical environment on chip.

At the size scales used in typical microfluidic devices, liquid flow is laminar, which results in inefficient mixing between fluid streams. In laminar flow mixers, mixing is solely through diffusion. When mixing two streams of fluid, the mixing time is dominated by time required for lateral diffusion between the streams; the length of the channel required is going to be approximately equal to (flow rate)×(diffusion time).

Rapidly mixing fluids on a micro scale requires either inducing some form of chaotic motion in the fluid flow, or reducing the lateral diffusion length required for mixing. For example, if two streams are changed to four interleaved streams, the length required for fluids to diffuse is divided by two. This is called "parallel lamination" mixing. Some micro-mixers take advantage of this by repeatedly splitting and then rejoining streams, creating a mixed stream with many laminations.

FIG. 13 shows a four to one micromixer (1300) in accordance with an embodiment of the method described in the present disclosure. The four to one mixer can be fabricated by way of teachings shown in the previous FIGS. 1-6. Four input ports (1310) are shown in FIG. 13. Fluid enters the four to one mixer (1300) through the four input ports (1310). A set of channels (1350) comprising four conducting channels (1320) is also shown in FIG. 13. Fluids are routed from the input ports (1310) to a containing region (1330) through the conducting channels (1320). The containing region (1330) comprises a plurality of pillars (1370), e.g., square pillars. The four to one micromixer (1300) relies on splitting and recombining the fluids around the square pillars (1370) thereby successively laminating the fluids and therefore reducing required diffusion length for mixing. The square pillars (1370) may also induce vortices in flow of the fluids, providing an additional mixing effect.

An output channel (1360) and an output port (1340) are also shown in FIG. 13. The fluids after being mixed in the containing region (1330) are conducted to the output port (1340) through the output channel (1360) and exit through the output port (1340).

FIG. 14 shows an eight to one micromixer (1400) in accordance to a further embodiment of the disclosure. Eight input ports (1410) are shown in FIG. 14. The eight to one mixer can be fabricated by way of teachings shown in the previous FIGS. 1-6. Fluids enter the eight to one micromixer (1400) through the input ports (1410). A first set of channels (1420) comprising eight channels (1450), a second set of channels (1430) comprising four channels (1460), a third set of channels (1440) comprising two channels (1470) and an output channel (1480) are also shown in FIG. 14. The fluids are successively combined together while being conducted in sequence from the input ports (1410) to the first set of channels (1420), from the first set of channels (1420) to the second set of channels (1430), from the second set of channels (1430) to the third set of channel (1440) and from the third set of channel (1440) to the output channel (1480). The output channel conducts the fluids to an output port (1490) and the fluids exit the eight to one mixer (1400) through the output port (1490). According to an embodiment of the disclosure and in contrast with the embodiment described in reference to FIG. 13, as a result of the fluids passing through the eight to one micromixer (1400) laminar unmixed flow of the fluids is provided at the output (1490).

In the following paragraphs, a method to build a microcapillary electrophoresis (MicroCE) chip in accordance with an embodiment of the present disclosure will be described.

Figure 15:
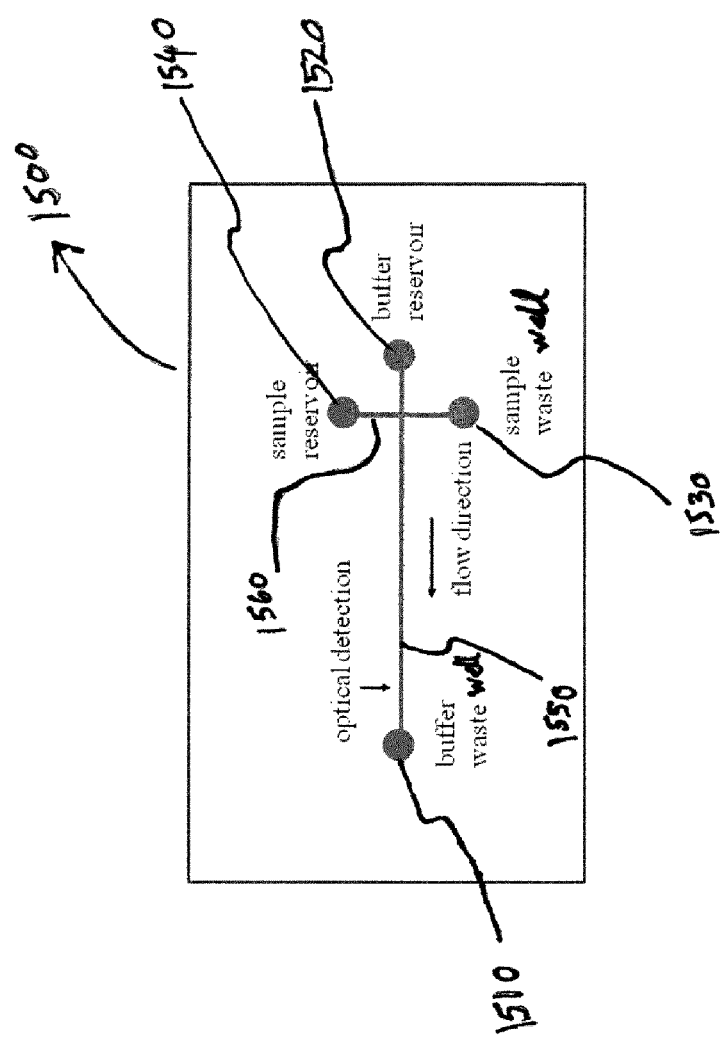
FIG. 15 shows a schematic of a typical microcapillary electrophoresis device.

Microcapillary electrophoresis (microCE) is a technique for separating molecules or particles based on charge in an aqueous solution. FIG. 15 shows a schematic of a typical microcapillary electrophoresis device (1500). The microcapillary electrophoresis device (1500) can be fabricated by way of teachings of the previous FIGS. 1-6. A buffer waste well (1510) and a buffer reservoir (1520) are also shown in FIG. 15. The buffer reservoir (1520) contains a buffer solution. The buffer solution is typically a dilute ionic solution. A sample reservoir (1540) and a sample waste well (1530) are shown in FIG. 15. A first channel (1550) and a second channel (1560) are also shown in FIG. 15. The first channel (1550) connects the buffer reservoir (1520) to the buffer waste well (1510). The second channel (1560) is intersected by the first channel (1550) and connects the sample reservoir (1540) to the sample waste well (1530). The elements (1510, 1520, 1530, 1540) are electrically contacted allowing for electric fields to be applied across the buffer reservoir (1520) and any of the buffer waste well (1510) or the sample waste well (1530). Also, electric fields can be applied across the sample reservoir (1540) and any of the buffer waste well (1510) or the sample waste well (1530).

When an electric potential is applied between the buffer reservoir (1520) and one or both the sample waste (1530) and the buffer waste (1510), electroosmotic flow is induced in the buffer solution. This carries the buffer solution from the buffer reservoir (1520) to the buffer waste (1510). When an electric potential is applied between the sample reservoir (1540) and one or both the sample waste (1530) and the buffer waste well (1510), analyte is injected into the first channel (1550). By initially filling the first channel (1550) with the buffer solution, and then performing a short injection of the analyte, a liquid "plug" of the analyte is created in the first channel (1550).

By then applying a potential along the second channel (1560), the analyte is forced down the second channel (1560) towards the sample waste well (1530). As this occurs, elements in the analyte travel at different velocities based on their charge and fluidic mobility. Thus, the analyte is dispersed as it travels down the second channel (1560). Analyte elements can be detected in a region just before the buffer waste well (1510) either electrically, or through induced fluorescence.

MicroCE systems are typically fabricated in silica (e.g., etched and sealed), or polymers (e.g., embossed, and then sealed). Electrodes are either placed the wells manually (e.g., thin platinum wire), or defined in a lithography/metal evaporation/liftoff process. Control and detection electronics are typically off chip.

A microCE system on chip with electrodes can be fabricated in accordance to the methods previously described in the present disclosure. Electrodes can be defined in a same layer as flow channels and wells. Wells can be defined by blind vias. According to an embodiment of the disclosure, no sealing layer on back of PCB board is required. In addition to electrodes for the wells, electrodes in a detection region can be fabricated, and/or a small well near a buffer waste well can be opened for optical access. By later depositing platinum on internal electrode tips through either electroplating, or electroless deposition, a portion of electrodes exposed to solutions can be made completely biocompatible. According to the method described in the present disclosure, control and detection electronics as well as microfluidic elements may be integrated on a same board. Such integration cannot be performed in conventionally manufactured microCE systems. Moreover, fluidic and electrode elements are defined and etched in same steps, reducing number of required manufacturing step and therefore, improving yield. Also, fabrication advantages over other PCB fabrication techniques (e.g., no open channel sealing) are maintained.

Figure 16:
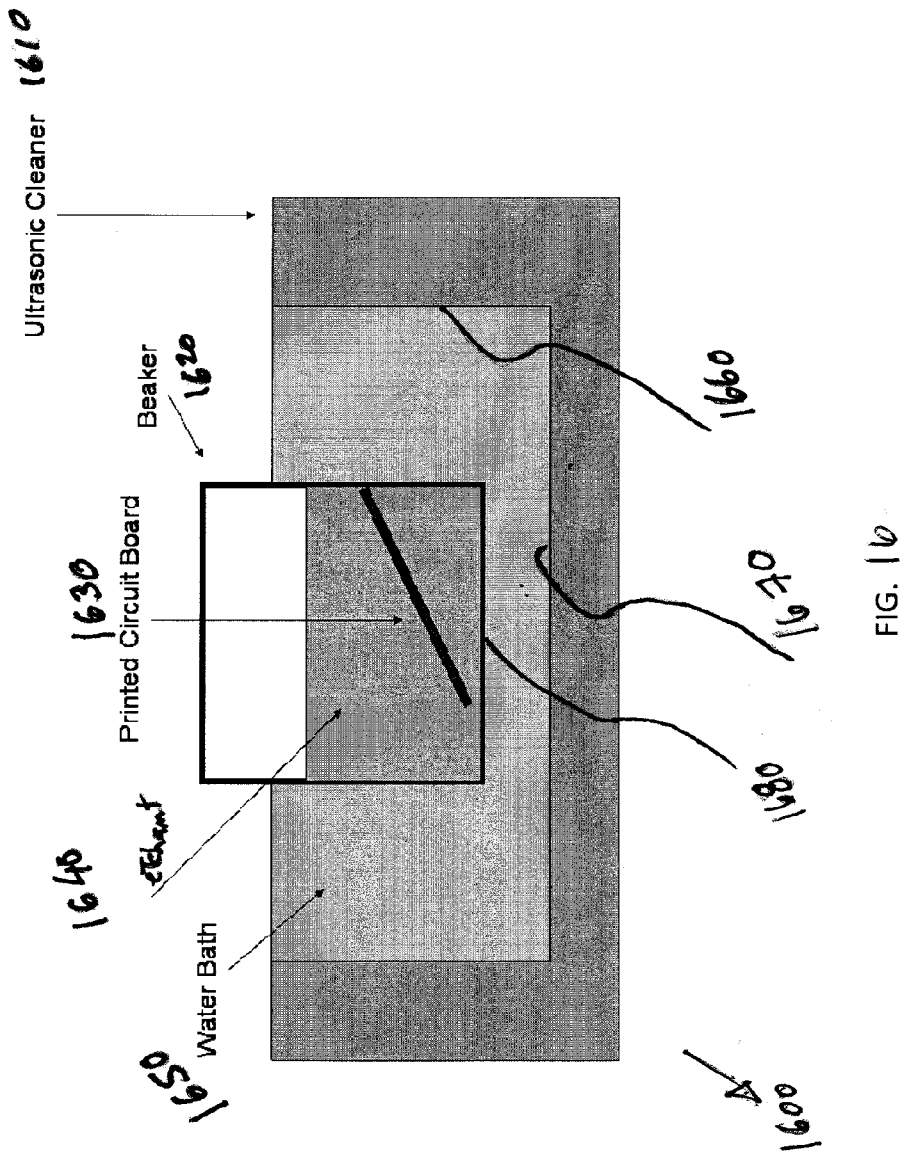
FIG. 16 shows an etching setup.

According to an embodiment of the disclosure, the etching process can be done by way of an ultrasonic bath. In what follows, an example of such etching process is described. FIG. 16 shows an etching setup (1600). An ultrasonic cleaner (1610) is shown in FIG. 16. The ultrasonic cleaner (1610) is a Branson 1510 Tabletop Ultrasonic Cleaner. The ultrasonic cleaner (1610) has sidewalls (1660) and a bottom wall (1670). An agitation frequency of 40 kHz was used. A beaker (1620) is shown in FIG. 16. The beaker (1620) comprises a beaker bottom wall (1680). The beaker (1620) is a 250 ml 4" beaker. An etchant (1640) contained in the beaker (1620) is also shown in FIG. 16. The etchant (1620) is MG Chemicals Ferric Chloride (FeCl3) which contains FeCl3 (40% by weight) and Hydrochloric acid (HCl) (1% by weight). In the embodiment of the Figure, applicants used 150 ml of etchant. FIG. 16 shows a PCB (1630). The PCB (1630) was immersed in the etchant (1640). A water bath (1650) is also shown in FIG. 16. The beaker (1620) was suspended in the water bath (1650) of the ultrasonic cleaner (1610) by a mechanical clamp not shown in FIG. 16. Suspending the beaker (1620) prevented any hard contact between the beaker (1620) and the side walls (1660) as well as the bottom wall (1670) of the ultrasonic bath. The PCB (1630) was not constrained in the beaker (1620). It is understood that the PCB (1630) can be positioned at an angle, or, simply laid flat on the beaker bottom wall (1680). The ultrasonic bath (1610) was turned on, and etching continued either for a predetermined time or until etching was complete.

In what follows, some etch rate characterization results related to the etching process described in reference to FIG. 16 are described.

Figure 17:
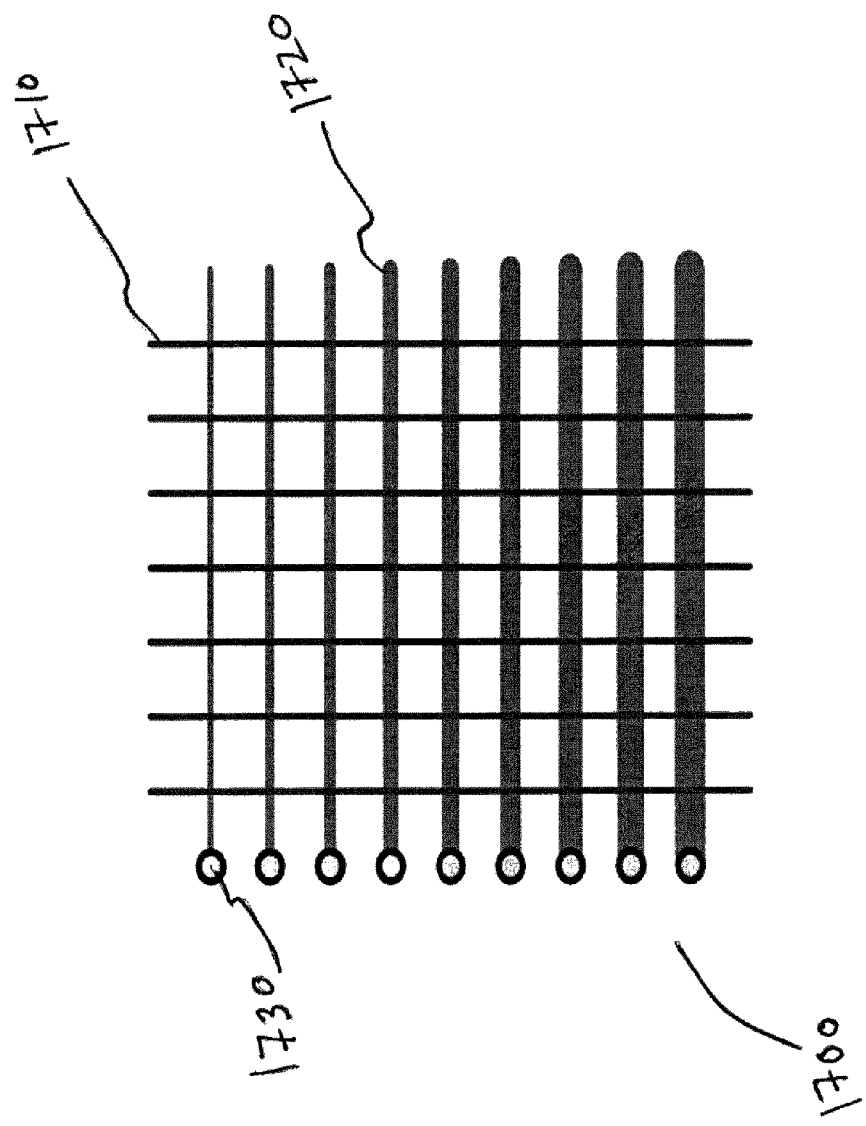
FIG. 17 shows a schematic of an etch rate test chip.

FIG. 17 shows a schematic (1700) of an etch rate test chip fabricated for etch characterization purpose. Lateral lines (1720) and vertical lines (1710) made of copper are shown in FIG. 17. The lateral lines (1720) are buried with widths ranging from ten mils (0.010 inches) in increment of five mils. The lateral lines (1720) and the vertical lines (1710) are not on a common a layer and they are not connected. Vias (1730) are also shown in FIG. 17. The vias (1730) are thirty three mils in size. The lateral lines (1720) are connected to surface of the etch rate test chip through the vias (1730).

Figure 18:
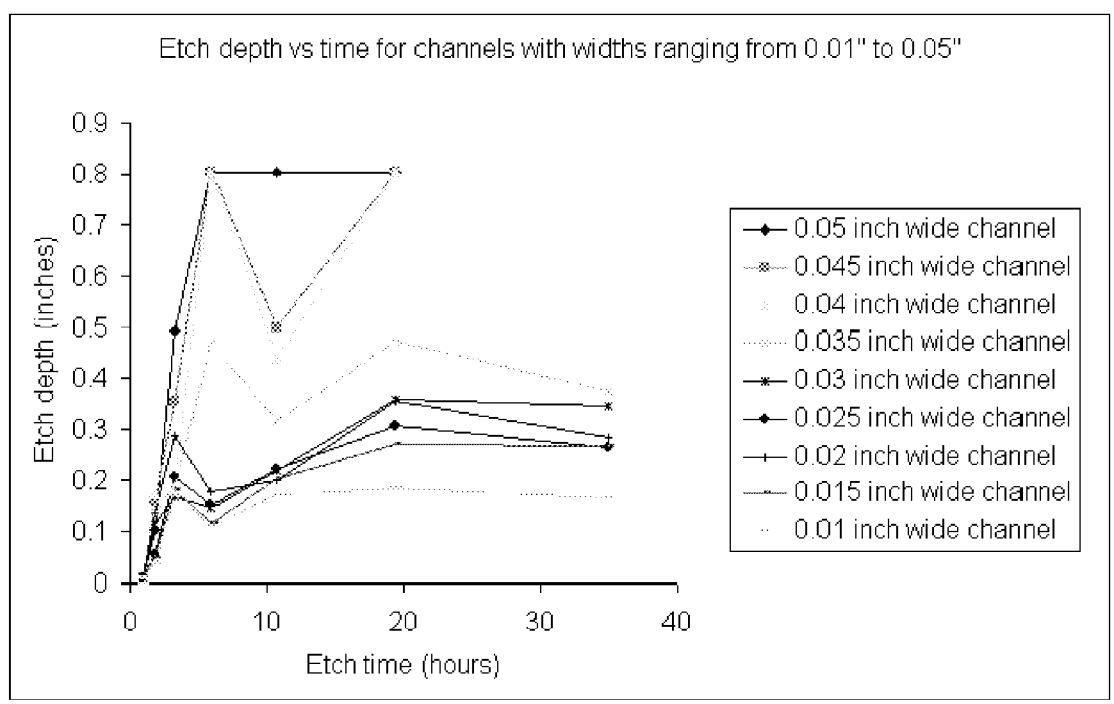
FIG. 18 shows plots of etch depth vs. time.

According to an example of the disclosure, a total of 10 of these etch rate test chips were fabricated, 7 were etched in a log-spaced time series from 1 to 35 hours (1, 1.8, 3.3, 5.9, 10.7, 19.4, 35 hrs). Each chip was etched for its allotted time, extracted from an etch solution, and etch depth was measured with digital calipers. The lateral lines (1720) are 0.82 inches long. FIG. 18 shows plots of etch depth vs. time. Since different chips were used for each etch time, the etch depth plots are not monotonic. This could be due to an anisotropic distribution of ultrasonic waves in the solution. It could also be due to bubble generation in cavity.

Thinner channels displayed significantly slower etch rates than wider channels. This will allow to perform differential etches. Consider a wide channel which intersects a thin channel; it will be possible to completely etch out the wider channel while only a minimal amount of the thin channel is etched. This can be used to create a buried electrode which directly connects to a fluid channel.

The examples set forth above are provided to give those of ordinary skill in the art a complete disclosure and description of how to make and use the embodiments of the devices, systems and methods of the disclosure, and are not intended to limit the scope of what the applicants regard as their disclosure. All patents and publications mentioned in the disclosure are indicative of the levels of skill of those skilled in the art to which the disclosure pertains. All references cited in this disclosure are incorporated by reference to the same extent as if each reference had been incorporated by reference in its entirety individually.

It is also to be understood that the terminology used herein is for the purpose of describing particular embodiments only, and is not intended to be limiting. As used in this specification and the appended claims, the singular forms "a," "an," and "the" include plural referents unless the content clearly dictates otherwise. The terms "multiple" and "plurality" includes two or more referents unless the content clearly dictates otherwise. Unless defined otherwise, all technical and scientific terms used herein have the same meaning as commonly understood by one of ordinary skill in the art to which the disclosure pertains.

A number of embodiments of the disclosure have been described. Nevertheless, it will be understood that various modifications may be made without departing from the spirit and scope of the present disclosure. In particular, modifications of the above-described modes for carrying out the disclosure that are obvious to persons of skill in the art are intended to be within the scope of the present disclosure. Accordingly, other embodiments are within the scope of the following claims.

The invention claimed is:

1. A method for fabrication of microfluidic systems on printed circuit boards, comprising:
   providing a printed circuit board comprising two or more layers of insulating material and one or more layers of metal, wherein at least one layer of metal is buried within two layers of insulating material;
   providing one or more layer of metal connecting the at least one buried layer of metal to a surface of the board; and
   etching at least a portion of the at least one buried layer of metal to provide one or more buried microfluidic channels.

2. The method of claim 1, wherein the etching is performed by immersing the printed circuit board in an etchant solution and agitating the etchant solution.

3. The method of claim 2, wherein the etchant solution is agitated by way of an ultra-sonic bath.

4. The method of claim 3, wherein the ultrasonic bath is provided in an ultrasonic cleaner.

5. The method of claim 1, wherein the etching is performed to further provide one or more via holes.

6. The method of claim 5, further comprising placing one or more tubes in the one or more via holes.

7. The method of claim 5, further comprising sealing some of the one or more via holes.

8. The method of claim 1, wherein two or more of the one or more layers of metal are made of different metals and wherein the etching etches selected metals of the different metals.

9. The method of claim 8, wherein the at least one the one or more microfluidic channels is in direct contact with a non-etched metal.

10. The method of claim 1, further comprising:
    masking, before etching, etchant access to layers of metals intended for electronic functions of the printed circuit board, in order to etch only layers of metals intended for fluidic functions of the printed circuit board, thereby providing a combined electronic/microfluidic printed circuit board.

11. The method of claim 1, wherein the one or more microfluidic channels form one or more connection manifolds, the method further comprising connecting the printed circuit board with the connection manifolds to one or more PDMS chips.

12. The method of claim 1, wherein the microfluidic systems comprise a four-to-one micromixer or an eight-to-one micromixer.

13. The method of claim 1, wherein the microfluidic systems comprise a microcapillary electrophoresis device.

* * * * *